United States Patent [19]

Okanobu et al.

[11] Patent Number: 5,300,826
[45] Date of Patent: Apr. 5, 1994

[54] INTERFACE CIRCUIT FOR AUDIO SIGNAL

[75] Inventors: Taiwa Okanobu, Tokyo; Hitoshi Tomiyama, Kanagawa, both of Japan

[73] Assignee: Sony Corporation, Tokyo, Japan

[21] Appl. No.: 916,377

[22] Filed: Jul. 21, 1992

[30] Foreign Application Priority Data

Jul. 29, 1991 [JP] Japan .................. 3-211637

[51] Int. Cl.⁵ .............................. H03F 3/45
[52] U.S. Cl. .................. 307/358; 307/494; 328/147; 328/149
[58] Field of Search ............ 328/147, 148, 149; 307/358, 494

[56] References Cited

U.S. PATENT DOCUMENTS

| | | | |
|---|---|---|---|
| 3,590,811 | 7/1971 | Harris | 328/147 |
| 4,241,455 | 2/1981 | Eibner | 328/146 |
| 4,405,901 | 9/1983 | Taguchi et al. | 330/261 |
| 4,460,821 | 7/1989 | Orban | 307/358 |
| 4,910,753 | 3/1990 | Wakatsuki et al. | 307/358 |
| 5,172,017 | 12/1992 | Schmidt | 307/494 |

FOREIGN PATENT DOCUMENTS 111396 6/1984 European Pat. Off. .

Primary Examiner—William L. Sikes
Assistant Examiner—Dinh Le
Attorney, Agent, or Firm—Lewis H. Eslinger; Jay H. Maioli

[57] ABSTRACT

An interface circuit for an audio signal includes a low-pass filter supplied with an audio signal with a DC component superposed thereon from a first circuit for extracting the DC component and a differential-input circuit. The differential-input circuit is supplied with the audio signal with the DC component superposed thereon from the first circuit and also supplied with the DC component extracted by the low-pass filter and the output of the differential-input circuit is supplied to a second circuit. In the differential-input circuit, the DC component superposed on the audio signal from the first circuit is canceled by the DC component from the low-pass filter so that only the audio signal is supplied to the second circuit. With the above described arrangement, terminal pins of an IC can be reduced in number.

4 Claims, 4 Drawing Sheets

INTERFACE CIRCUIT FOR AUDIO SIGNAL

BACKGROUND OF THE INVENTION

1. Field of the Invention

The present invention relates to an interface circuit for audio signal.

2. Description of the Related Art

The cost of an IC increases with an increase in the number of terminal pins. Further, when the number of terminal pins increases, the number of external parts also increases. In such state, the layout of the wiring pattern of the printed board on which the IC and external parts are mounted becomes complicated and, hence, the cost of the overall device including the printed board and external parts increases.

Further, the increase in the number of terminal pins makes miniaturization of the IC package unachievable and, combined with the increase in number of external parts, prevents downsizing of the apparatus using ICs. Furthermore, when there are a large number of terminal pins, such troubles as solder bridging easily occur during the mounting of the IC, and this also leads to an increase in cost.

Therefore, the increase in the number of terminal pins brings about a great disadvantage for ICs and apparatus using ICs.

Figure 4:
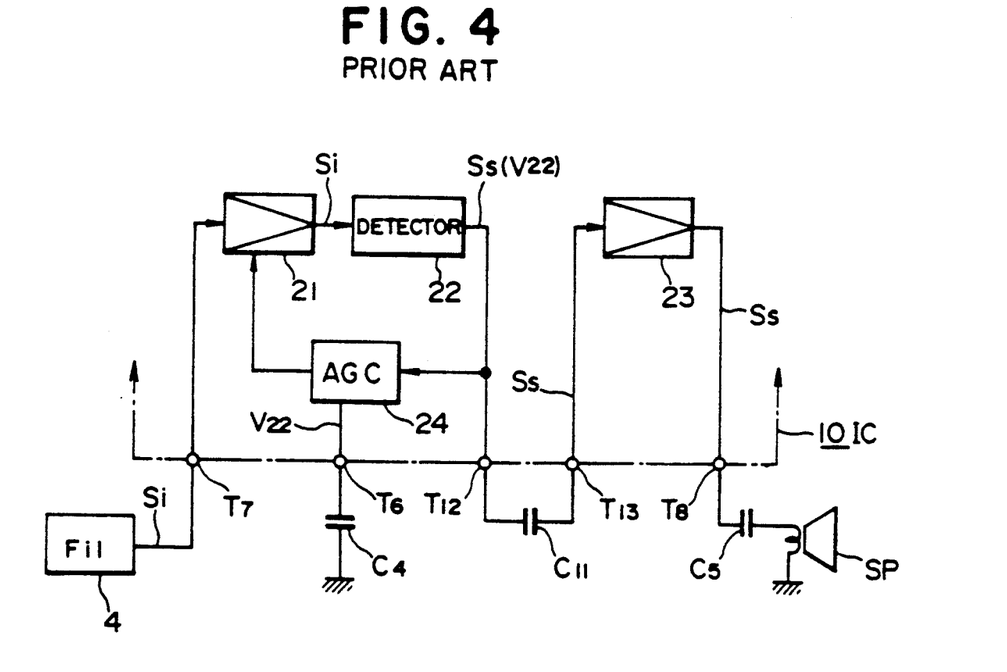
FIG. 4 is a system diagram of a conventional example.

Now, circuits around an AM detector and an audio amplifier a subsequent stage of a radio receiver are arranged in an IC for example, as shown in FIG. 4.

Referring to FIG. 4, reference numeral 10 denotes a one-chip IC for an AM receiver, in which an intermediate-frequency signal Si from an external ceramic filter 4 is supplied to an amplifier 21 through a terminal pin T7 and the intermediate-frequency signal Si from the amplifier 21 is supplied to an AM detector 22 to be subjected to AM detection therein, and thereby, an audio signal Ss and a D.C. component V22 at a level corresponding to the level of the intermediate-frequency signal Si are obtained. Then, the audio signal Ss of the detection output is supplied to an audio amplifier 23 through a signal line passing through a terminal pin T12→an external capacitor C11→a terminal pin T13. The signal Ss from the amplifier 23 is supplied, through a terminal pin T8 and a DC blocking capacitor C5, to a speaker SP.

At the same time, the detection output of the detector 22 is supplied to an AGC voltage generator 24 and, therein, an AGC voltage is generated from the DC component V22. This AGC voltage is supplied to the amplifier 21 as the control signal for its gain and, thereby, an AGC operation is performed on the intermediate-frequency signal Si. For this purpose, the generator 24 is connected to capacitor C4 through a terminal pin T6. This capacitor C4 forms a low-pass filter and the DC voltage 22 is extracted thereby from the detection output and the AGC voltage is generated from this DC voltage V22.

In the arrangement of FIG. 4, the capacitor C11 is provided for blocking the DC-component V22 included in the detection output of the detector 22 and also for supplying the AC component (audio signal) to the amplifier 23 and, therefore, the capacitor C11 is required to leave a capacitance of several $\mu F$. Hence, the capacitor C11 cannot be arranged in the IC but has to be externally attached to the IC 10 as shown in FIG. 4.

Further, the capacitor C4 is provided for extracting the DC component V22 included in the detection output of the detector 22 as the AGC voltage and, hence, it has to have a capacitance of several $\mu F$. Therefore, this capacitor C4 also cannot be arranged in the IC but has to be externally attached to the IC 10 as shown in FIG. 4.

Then, by such provision of the capacitors C11 and C4 external to the IC 10, the number of the terminal pins of the IC 10 is increased and the above mentioned problems are created.

SUMMARY OF THE INVENTION

An object of the present invention is to provide a detector in which the above mentioned problems are solved.

According to the present invention, there is provided an interface circuit, which, with parts denoted by reference numerals corresponding to those used in the later described embodiment, is disposed between a first circuit 22 outputting an audio signal Ss having a DC component V22 superposed thereon and a second circuit 23 processing the audio signal Ss and comprises a low-pass filter 241 supplied with the audio signal Ss having the DC component V22 superposed thereon from the first circuit 22 for extracting the DC component V22 and a differential-input circuit 231.

In the above described arrangement, it is arranged such that the differential-input circuit 231 is supplied with the audio signal Ss with the DC component V22 superposed thereon from the first circuit 22 and the DC component V22 extracted by the low-pass filter 241, and the output of the differential-input circuit 231 is supplied to the second circuit 23.

In the differential-input circuit 231, the DC component V22 superposed on the audio signal Ss from the first circuit 22 is canceled by the DC component V22 from the low-pass filter 241 so that only the audio signal Ss is supplied to the second circuit 23.

DESCRIPTION OF THE PREFERRED EMBODIMENTS

Figure 1:
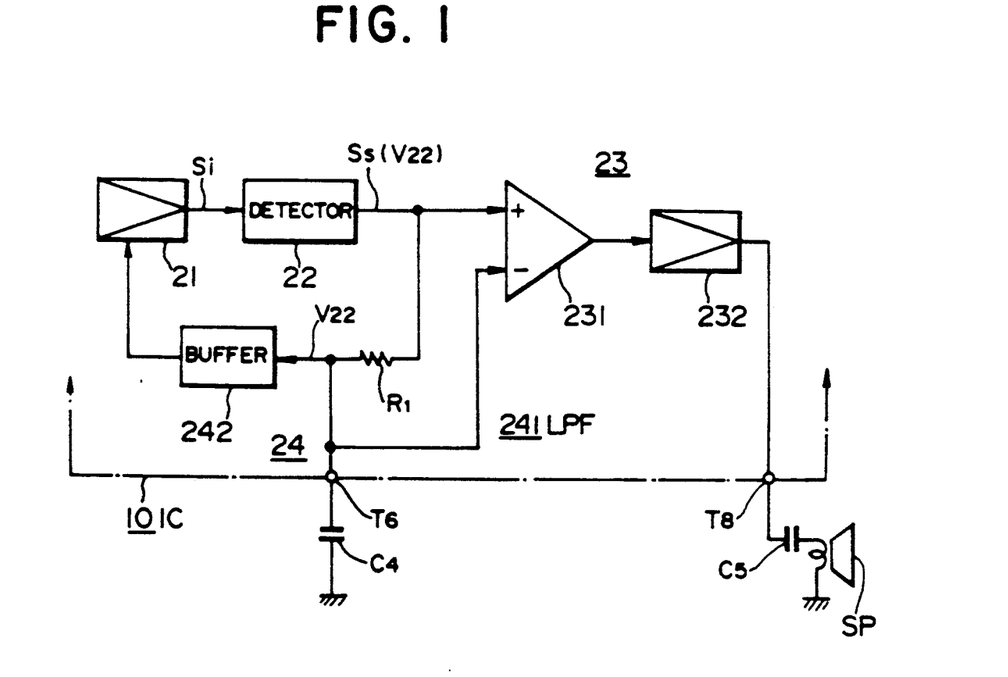
FIG. 1 is a system diagram of an example of the present invention.

Referring to FIG. 1, an intermediate-frequency signal Si from an amplifier 21 is supplied to the AM detector 22 for AM detection and, thereby, an audio signal Ss and a DC component V22 are extracted as the detection output to be supplied to the audio amplifier 23. The audio amplifier 23 in this case is formed of a preamplifier 231 and a power amplifier 232, of which the amplifier 231 is provided with differential inputs, and one of the differential inputs is adapted to receive the detection output of the detector 22.

The detection output of the detector 22 is also supplied to a low-pass filter 241. The low-pass filter 241 is formed of a resistor R1 and a capacitor C4 and constitutes the front stage of the AGC voltage generator 24. The resistor R1 is incorporated in the IC 10, while the capacitor C4 is externally connected to the IC 10 through the terminal pin T6. The DC component V22 is extracted from the detection output by the low-pass filter 241, and this DC component V22 is supplied to the other input of the differential inputs of the amplifier 231.

Further, the DC component V22 from the filter 241 is supplied as the AGC voltage to the amplifier 21 through a buffer amplifier 242, constituting the rear stage of the AGC voltage generator 24.

In the above described arrangement, since the detection output of the detector 22 includes the DC component V22, the audio signal Ss, together with the DC component V22, is supplied to the amplifier 231. Meanwhile, the DC component V22 included in the detection output is extracted by the low-pass filter 241 and the thus obtained DC component V22 is supplied to the other input of the differential inputs of the amplifier 231.

Therefore, it can be equivalently said that the amplifier 231 is supplied only with the audio signal Ss as the differential between the detection output from the detector 22 and the DC component V22 from the filter 241. This audio signal Ss is amplified by the amplifiers 231 and 232 to be supplied to a speaker SP.

Meanwhile, the DC component V22 extracted by the filter 241 is supplied, through the buffer amplifier 242, to the amplifier 21 as the AGC voltage and thereby an AGC operation is performed.

Thus, according to the present invention, the audio signal Ss from the detector 22 can be supplied to the amplifier 23. However, specifically in this case of the present invention, since the detection output of the detector 22 and the DC component V22 included in the detection output are supplied to the differential inputs of the amplifier 231, it can be equivalently said that the amplifier 23 is supplied with the audio signal Ss alone out of the detection output of the detector 22, and therefore, there is no need for providing a capacitor for DC blocking between the detector 22 and the amplifier 23. Accordingly, the need for the terminal pins for providing such a DC blocking capacitor external to the IC 10 can be eliminated and the two terminal pins T12 and T13 in FIG. 4 can be eliminated.

Further, since the DC component V22 from the low-pass filter 241 is used both as the voltage canceling the DC component V22 supplied to the amplifier 231 together with the audio signal Ss and as the AGC voltage, the capacitor C4 is serving functions of both the capacitor Cll and the capacitor C4 in FIG. 4. Therefore, the number of external capacitors can also be reduced.

Figure 2:
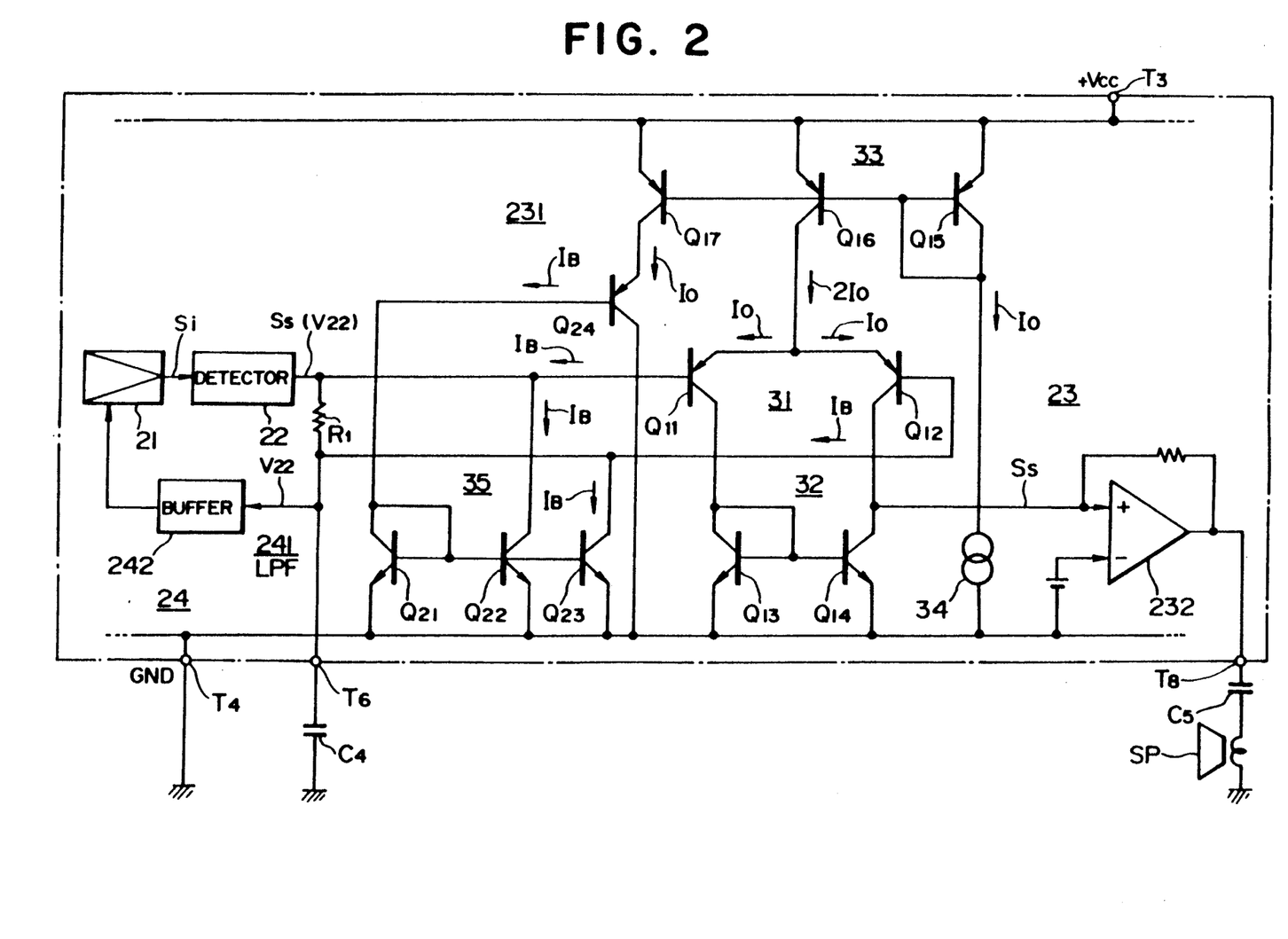
FIG. 2 is a connection diagram of an example of the present invention.

FIG. 2 shows a particular example of the preamplifier 231.

The emitters of transistors Q11 and Q12 are commonly connected to the collector of a transistor Q16 for constant-current power supply and the emitter of the transistor Q16 is connected to a terminal pin T3 for power supply for the IC 10 and, thereby, a differential amplifier 31 is arranged. The collectors of the transistors Q11 and Q12 are connected with a current mirror circuit 32 formed of transistors Q13 and Q14, and the current mirror circuit 32 has a terminal pin T4, for grounding the IC 10, as the reference potential point.

The base of the transistor Q11 is supplied with the detection output of the detector 22, i.e., the audio signal Ss and DC component V22, while the base of the transistor Q12 is supplied with the DC component V22 from the low-pass filter 241, and the collector outputs of the transistors Q12 and Q14 is supplied to the amplifier 232.

The transistor Q16, together with transistors Q15 and Q17, constitutes a current mirror circuit 33, which has the terminal pin T3 as the reference potential point and has the transistor Q15 on its input side connected to a constant-current circuit 34.

Further, transistors Q21 to Q23 constitute a current mirror circuit 35 having the terminal pin T4 as the reference potential point, and the collector of the transistor Q21 on the input side is connected with the base of a transistor Q24 and the emitter of this transistor Q24 is connected with the collector of the transistor Q17, while the collectors of the transistors Q22 and Q23 are connected with the bases of the transistors Q11 and Q12, respectively.

All the transistors except the transistor Q16 are arranged to have the same characteristics. The base-emitter junction area of the transistor Q16 is selected to be double the base-emitter junction area of the transistor Q17 so that, when the collector current of the transistor Q17 is IO, the collector current of the transistor Q16 becomes two times as large as that, i.e., 2 IO.

In the described arrangement, while the transistors Q11 and Q12 constitute the differential amplifier 31, the signal Ss, together with the DC component V22, as the detection output is applied to the base of the transistor Q11 and the DC component V22 is applied to the base of the transistor Q12. Therefore, application of these signals to the transistors Q11 and Q12 is equivalent to application to them of the signal Ss alone. Accordingly, the signal Ss is amplified by the amplifier 231 and output from the collectors of the transistors Q12 and Q14 to be supplied to the amplifier 232.

Thus, as described above, no DC blocking capacitor Cll, as was used in the case of FIG. 4, is required to be inserted between the detector 22 and the amplifier 231, these circuits can be directly coupled.

Since, at this time, the collector current of the transistor Q16 is 2 IO, the emitter currents of the transistors Q11 and Q12 each become IO. Further, since the collector current of the transistor Q17 is IO, the emitter current of the transistor Q24 also becomes IO. Hence, if the base current of the transistor Q24 when an emitter current of IO is given to the transistor Q24 is represented by IB, the base currents of the transistors Q11 and Q12 each become IB.

Since the base current IB of the transistor Q24 is supplied to the transistor Q21 of the current mirror circuit 23, collector currents IB also flow into the collectors of the transistors Q22 and Q23, respectively. This means that the base currents IB of the transistors Q11 and Q12 flow into the collectors of the transistors Q22 and Q23, respectively, and, hence, the base currents IB of the transistors Q11 and Q12 do not at all flow through the resistor Rl.

Since, no voltage drop is produced across the resistor RI, the DC component V22 included in the detection output of the detector 22 and the DC component V22 from the filter 241 become equal. Accordingly, neither DC offset in the output signal Ss from the transistors Q12 and Q14 nor deviation of the operating point of the amplifier 232 occurs.

Below will be described an example of application of the above described input circuit with reference to FIG. 3.

Figure 3:
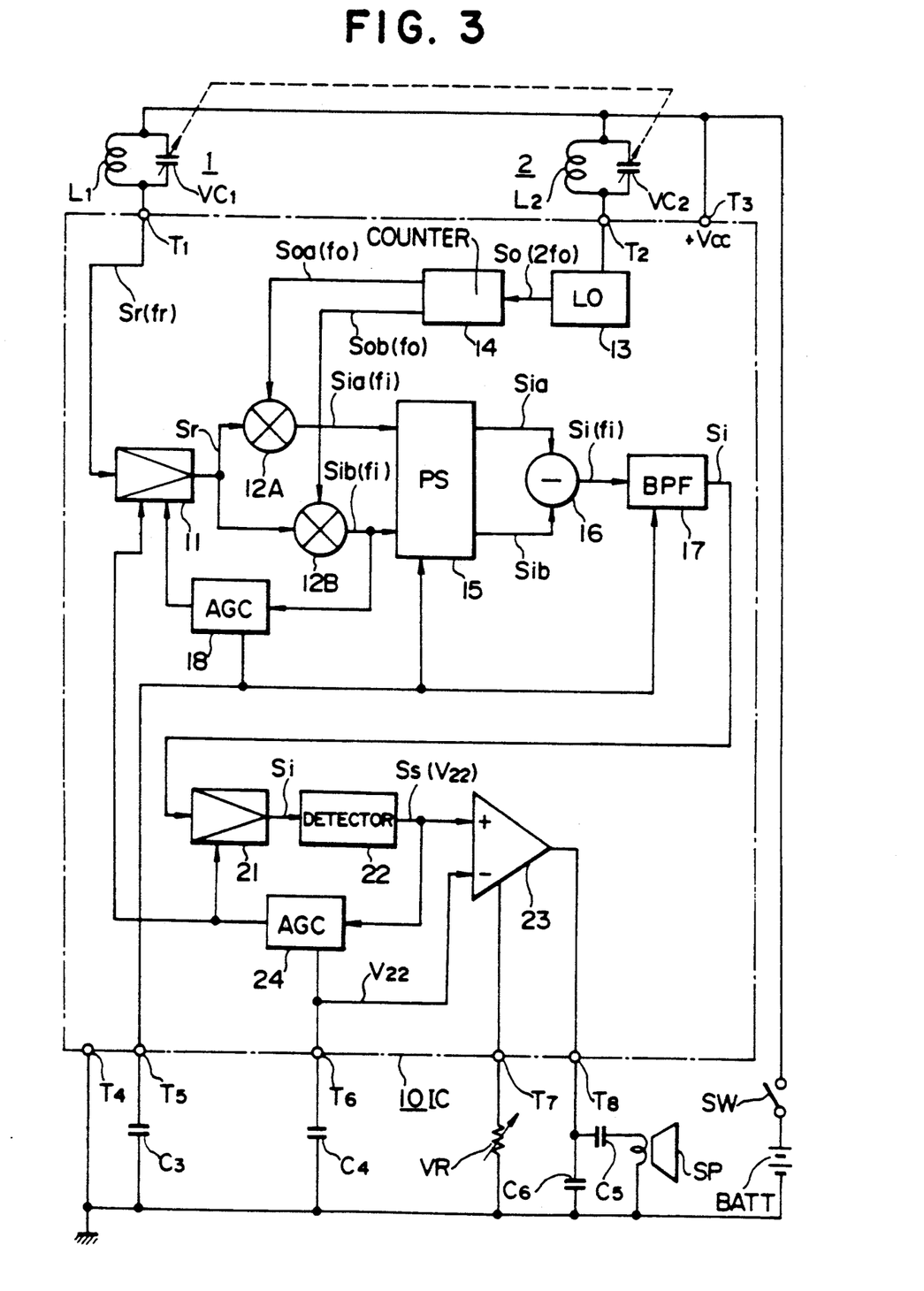
FIG. 3 is a system diagram of an example of application of the present invention.

Referring to FIG. 3, the portion enclosed by the chain line shows an IC 10 for an AM receiver arranged as a one-chip IC and T1 to T8 denote its terminal pins. Incidentally the basic concept of the IC 10 shown by the portion enclosed by the chain line in FIG. 3 is disclosed in Japanese Patent Publication No. 1-273432 and corresponding U.S. Pat. No. 5,020,147 earlier applied for patent by the applicant hereof. This embodiment is an application of the present invention to the AM receiver desioned with that basic concept.

Parts shown on the outside of the chain line are external parts or circuits, of which reference numeral 1 denotes an antenna tuning circuit and 2 denotes a resonance circuit for local oscillation. The tuning circuit 1 is formed of a bar antenna (antenna tuning coil) L1 and a variable capacitor VC1, while the resonance circuit 2 is formed of a local oscillation coil L2 and a variable capacitor VC2 associated with the variable capacitor VC1.

Further, SW denotes a power switch, BATT denotes a battery of 3 V, for example, for power supply, VR is a variable resistor for volume control, and SP denotes a speaker.

A broadcast wave signal (AM wave signal) Sr with a frequency of fr, i.e., $$Sr = Er \cdot \sin\omega r \, t,$$

$$\omega r = 2\pi fr$$

is selected by the antenna tuning circuit 1 and output therefrom. Since only the relative-amplitude and phase of signals concerned influence the below described signal processing, the initial phase of each signal is neglected in the above expression and the following description.

The signal Sr is supplied to a high-frequency amplifier 11 through the pin T1 of the IC 10 and the signal Sr from the amplifier 11 is supplied to mixers 12A and 12B.

A local oscillation circuit 13 is connected to the resonance circuit 2 through the terminal pin T2 and it generates a local oscillation signal So. At this time, the oscillation frequency So is set to be 2 fo, which is expressed as $$2 fo = (fr + fi) \times 2,$$

where fi denotes the intermediate frequency and fi = 55 kHz.

The oscillation signal So is supplied to a counter 14 and divided thereby into local oscillation signals Soa and Sob having half the original frequency and a phase difference of 90° therebetween. Namely, the signal So is divided into $$Soa = Eo \cdot \cos\omega o \, t,$$

$$Sob = Eo \cdot \sin\omega o \, t,$$

$$\omega o = 2\pi fo.$$

These signals Soa and Sob are supplied to the mixers 12A and 12B so that both are multiplied therein by the signal Sr. Thereby, from the mixers 12A and 12B, the following signals Sia and Sib are output:

$$
\begin{aligned}
Sia &= Sr \cdot Soa \\
&= Er \cdot \sin\omega r \, t \cdot Eo \cdot \cos\omega o \, t \\
&= a \{\sin(\omega r + \omega o)t + \sin(\omega r - \omega o)t\}
\end{aligned}
$$

$$
\begin{aligned}
Sib &= Sr \cdot Sob \\
&= Er \cdot \sin\omega r \, t \cdot Eo \cdot \sin\omega o \, t \\
&= a\{-\cos(\omega r + \omega o)t + \cos(\omega r - \omega o)t\}
\end{aligned}
$$

-continued $$\omega r = 2\pi fr,$$
$$a = Er \cdot Eo/2.$$

Of these signals Sia and Sib, as described later, signal components having the angular frequency ($\omega r - \omega o$) are used as the intermediate-frequency signals and signal components having the angular frequency ($\omega R + \omega o$) are eliminated. Therefore, by neglecting, for simplicity, the signal components having the angular frequency ($\omega r + \omega o$), we obtain $$Sia = a\pi\sin(\omega r - \omega o)t,$$

$$Sib = a \cdot \cos(\omega r - \omega o)t.$$

At this time, since the image signal Sm is expressed as $$Sm = Em \cdot \sin\omega m \, t$$

$$\omega m = \omega o + \omega i$$

$$\omega i = 2\pi fi,$$

if the image signal Sm is included in the broadcast wave signal Sr from the tuning circuit 1, the signals Sia and Sib at this time are expressed as $$Sia = a \cdot \sin(\omega r - \omega o)t + \beta \cdot \sin(\omega m - \omega o),$$

$$Sib = a \cdot \cos(\omega r - \omega o)t + \beta \cdot \cos(\omega m - \omega o),$$

$$\beta = Em \cdot Eo/2.$$

Further, since $$\omega r < \omega o < \omega m,$$

the above expressions become $$
\begin{aligned}
Sia &= a \cdot \sin(\omega r - \omega o)t + \beta \cdot \sin(\omega m - \omega o) \\
&= -a \cdot \sin(\omega o - \omega r)t + \beta \cdot \sin(\omega m - \omega o),
\end{aligned}
$$

$$
\begin{aligned}
Sib &= a \cdot \cos(\omega r - \omega o)t + \beta \cdot \cos(\omega m - \omega o) \\
&= a \cdot \cos(\omega o - \omega r)t + \beta \cdot \cos(\omega m - \omega o).
\end{aligned}
$$

These signals Sia and Sib are supplied to a phase shifter 15. The phase shifter 15 is formed, for example, of an active filter using capacitors, resistors, and operational amplifiers and produces a phase shift of 90° ±1° between the input two signals Sia and Sib within the frequency range of 55 kHz±10 kHz. Thus, the signal Sib is phase delayed by of 90° from the signal Sia in the phase shifter 15 such that $$
\begin{aligned}
Sia &= -a \cdot \sin(\omega o - \omega r)t + \beta \cdot \sin(\omega m - \omega o),
\end{aligned}
$$

$$
\begin{aligned}
Sib &= a \cdot \cos(\omega o - \omega r + 90°)t + \\
&\quad \beta \cdot \cos(\omega m - \omega o + 90°), \\
&= a \cdot \sin(\omega o - \omega r)t + \beta \cdot \sin(\omega m - \omega o).
\end{aligned}
$$

These signals Sia and Sib are supplied to a subtractor 16 for subtraction, and from the subtractor 16 is output a signal Si expressed as $$Si = Sib - Sia$$
$$= \alpha \cdot \sin(\omega o - \omega r)t + \beta \cdot \sin(\omega m - \omega o) -$$
$$\{-\alpha \cdot \sin(\omega o - \omega r)t + \beta \cdot \sin(\omega m - \omega o)\}$$
$$= 2\alpha \cdot \sin(\omega o - \omega r)t.$$

Since, here, $$\omega o - \omega r = 2\pi (fo - fr)$$
$$= 2\pi fi,$$

the signal Si is the desired intermediate-frequency signal. Further, even if the image signal Sm is included in the broadcast wave signal Sr from the tuning circuit 1, the signal components resulting from the image signal Sm are canceled and not included in the intermediate-frequency signal Si.

Thus, the intermediate-frequency signal Si (and signal components with the angular frequency $\omega r + \omega o$) and the like) converted from the broadcast signal Sr are output from the subtractor 16.

The intermediate-frequency signal Si is supplied to a bandpass filter 17 for filtering intermediate frequency waves. The bandpass filter 17 is formed, for example, of a biquad type active filter using capacitors, resistors, and operational amplifiers, and its passband is set to 55 kHz+3 KHz. Thus, unwanted signal components are attenuated by the bandpass filter 17 and only the intermediate-frequency signal Si can be obtained.

The obtained intermediate-frequency signal Si is supplied to the AM detector 22 through the amplifier 21 and thereby the audio signal Ss (and the DC component V22 at the level corresponding to the level of the intermediate-frequency signal Si) is extracted and this audio signal Ss is supplied to the audio amplifier 23 with differential inputs. The signal Ss output from the amplifier 23 is supplied to the speaker SP through the pin T8 and the capacitor C5.

Further, the signal Sib from the mixer 12B is supplied to an AGC voltage generator 18 and an AGC voltage is generated therein and this AGC voltage is supplied to the amplifier 11 as the control signal for its gain and, thereby, the signals Sia and Sib are given an AGC treatment. In this case, the generator 18 is connected to a capacitor C3 through the pin T5 and a low-pass filter is constituted of the capacitor C3, and, thereby, the DC component serving as the AGC voltage is obtained. The AGC voltage is also supplied to the operational amplifiers constituting the phase shifter 15 and the bandpass filter 17 as their reference voltage.

Further, the detection output of the detector 22 is supplied to the AGC voltage generator 24 and the DC component V22 is extracted and an AGC voltage is generated from this DC component V22. The AGC voltage is supplied to the amplifiers 11 and 21 as the control signals for their gains and, thereby, the intermediate frequency signals Sia, Sib, and Si are given AGC treatments. The DC component V22 is further supplied to the differential input of the amplifier 23 and, thereby, the DC component V22 supplied from the detector 22 to the amplifier 23 together with the audio signal Ss is equivalently canceled.

The amplifier 23 is connected to a variable resistor VR through the pin T7 so that the gain of the amplifier 23 is controlled in accordance with the resistance value of the variable resistor VR. Thus, the volume is controlled by this variable resistor VR.

The capacitor C6 is provided for bypassing other signal components than the audio signal Ss.

In the described way, broadcasting can be received. Since, in this case, the bandpass filter 17 is formed of an active filter comprising capacitors and resistors, it can be incorporated in the IC 10 and, thereby, two terminal pins can be reduced. As is apparent from FIG. 3, the IC 10 requires only eight terminal pins T1 to T8.

Since the superheterodyne system is adopted as the reception system, sufficient selectivity can be obtained and characteristics against disturbances such as radio interference can be improved.

Further, the intermediate frequency fi is sufficiently lower than the general intermediate frequency or receiving bandwidth. Hence, when arranged in an IC, the area occupied by one stage of the bandpass filter (intermediate-frequency filter) 17 becomes large, but the stages of the same for obtaining a required selectivity can be reduced in number. Therefore, the area occupied by the entire bandpass filter 17 in an IC 10 becomes small making it possible to arrange it in the IC.

The image characteristic becomes worse when the intermediate frequency fi is low. However, since the image signal Sm is eliminated by means of the circuits 12A, 12B; 15 and to 16, the image characteristic is prevented from becoming worse.

There are limits in the signal level which can be handled by the phase shifter 15 and the bandpass filter 17 because both the circuits 15 and 17 are formed of an active filter. However, since AGC is applied to the amplifier 11, application of excessive input to the phase shifter 15 and the bandpass filter 17 can be prevented.

In the above described arrangement, if the detector 22 is an FM detector, the DC component V22 can be used as the AFC voltage. When there is an apparatus, other than a receiver, in which it is required that an audio signal with a DC component superposed thereon is supplied to a circuit in the next stage without using a DC blocking capacitor, this invention can be effectively applied to such apparatus.

According to the present invention, the DC component V22 is extracted from the detection output of the detector 22 and the AGC voltage is generated therefrom and the DC component V22 generating the AGC voltage is supplied to the amplifier 23. Hence, the detection output of the detector 22 can be directly applied to the amplifier 23. Accordingly, the need for providing a DC blocking capacitor between the detector 22 and the amplifier 23 and, hence, the need for the terminal pins for providing such a capacitor external to the IC 10 can be eliminated. Thus, two terminal pins can be reduced.

Further, since one capacitor can be used for the capacitor for DC blocking as well as for generating the AGC voltage, one of the capacitors provided external to the IC 10 can be reduced.

What is claimed is:

1. An interface circuit for an audio signal provided between a first circuit outputting the audio signal with a DC component superposed thereon and a second circuit processing the audio signal comprising:

a low-pass filter supplied with the audio signal with the DC component superposed thereon from said first circuit for extracting the DC component therefrom; and a differntial-input circuit supplied at a first input with the audio signal with the DC component superposed thereon from said first circuit and supplied at a second input with the DC component extracted by said low-pass filter;

wherein said differential input circuit includes a differential amplifier comprising a first transistor and a second transistor, the base of said first transistor forming said first input and the base of said second transistor forming said second input, respective emitters of aid first and second transistors being commonly connected to the collector of a third transistor, the emitter of said third transistor being commonly connected to the emitters of a fourth transistor and a fifth transistor and to a terminal pin receiving power, the base of said third transistor being commonly connected to the bases of said fourth transistor and said fifth transistor, the collector of said fourth transistor being commonly connected to the base of said fourth transistor and to a constant current circuit, the collector of said fifth transistor being connected to the emitter of a sixth transistor, the collector of said sixth transistor being commonly connected to the emitters of a seventh transistor, an eighth transistor, a ninth transistor, and ground, the bases of said seventh, eighth, and ninth transistors being commonly connected together, the collector of said ninth transistor being commonly connected to its base and to the base of said sixth transistor, the collector of said eighth transistor being connected to the base of said first transistor forming said first input and the collector of said seventh transistor being connected to the base of said second transistor forming said second input;

whereby an output of said differential-input circuit is supplied to said second circuit for processing the audio signal 2. An interface circuit for an audio signal provided between a detector and an audio amplifier amplifying the audio signal from said detector comprising:

a low-pass filter supplied with a detection output of said detector for extracting a DC component included in said detection output; and a differential-input amplifier supplied at a first input with said detection output of said detector and said differential-input amplifier supplied at a second input with the DC component extracted by said low-pass filter;

wherein said differential input circuit includes a differential amplifier comprising a first transistor and a second transistor, the base of said first transistor forming said first input and the base of said second transistor forming said second input, respective emitters of said first and second transistors being commonly connected to the collector of a third transistor, the emitter of said third transistor being commonly connected to the emitters of a fourth transistor and a fifth transistor and to a terminal pin receiving power, the base of said third transistor being commonly connected to the bases of aid fourth transistor and aid fifth transistor, the collector of said fourth transistor being commonly connected to the base of said fourth transistor and to a constant current circuit, the collector of said fifth transistor being connected to the emitter of a sixth transistor, the collector of said sixth transistor being commonly connected to the emitters of a seventh transistor, an eighth transistor, a ninth transistor, and ground, the bases of said seventh, eighth, and ninth transistors being commonly connected together, the collector of said ninth transistor being commonly connected to its base and to the base of said sixth transistor, the collector of said eighth transistor being connected to the base of said first transistor forming said first input and the collector of said seventh transistor being connected to the base of said second transistor forming said second input;

whereby an output of said differential-input amplifier is supplied to said audio amplifier for amplifying the audio signal.

3. An interface circuit for an audio signal provided between an AM detector and an audio amplifier amplifying the audio signal from said AM detector comprising:

a low-pass filter supplied with a detection output of said AM detector for extracting a DC component included in the detection output; and a differential-input amplifier having first and second differntial inputs supplied respectively with the detection output of said AM detector and the DC component extracted by said low-pass filter; wherein said differential amplifier includes a first transistor and a second transistor, the base of said first transistor forming said first input and the base of said second transistor forming said second input, respective emitters of said first and second transistors being commonly connected to the collector of a third transistor, the emitter of said third transistor being commonly connected to the emitters of a fourth transistor and a fifth transistor and to a terminal pin receiving power, the base of said third transistor being commonly connected to the bases of said fourth transistor and said fifth transistor, the collector of said fourth transistor being commonly connected to the base of said fourth transistor and to a constant current circuit, the collector of said fifth transistor being connected to the emitter of a sixth transistor, the collector of said sixth transistor being commonly connected to the emitters of a seventh transistor, an eighth transistor, a ninth transistor, and ground, the bases of said seventh, eighth, and ninth transistors being commonly connected together, the collector of said ninth transistor being commonly connected to its base and to the base of said sixth transistor, the collector of said eighth transistor being connected to the base of said first transistor forming said first input and the collector of said seventh transistor being connected to the base of said second transistor forming said second input;

whereby an output of said differential-input amplifier is supplied to said audio amplifier for amplifying the audio signal and the DC component extracted by said low-pass filter is supplied to an AGC circuit for performing an AGC operation on said audio amplifier.

4. The interface circuit of claim 3, wherein said AGC circuit further comprises a buffer amplifier, which is fed the DC component extracted by said low-pass filter.

* * * * *

UNITED STATES PATENT AND TRADEMARK OFFICE
CERTIFICATE OF CORRECTION

PATENT NO. : 5,300,826
DATED : April 5, 1994
INVENTOR(S) : Taiwa Okanobu and Hitoshi Tomiyama It is certified that error appears in the above-indentified patent and that said Letters Patent is hereby corrected as shown below:

```
Col. 1, line 29, after "amplifier" insert --in--
        line 54, after "to" insert --a--
        line 64, change "leave" to --have--
Col. 2, line 45, after "of" insert --an--
Col. 4, line 33, after "231," insert --and--
        line 66, after "Incidentally" insert --,--
Col. 5, line 4, change "desioned" to --designed--
Col. 6, line 8, change "ωR" to --ωr--
        line 14, change "αη" to --α.--
     line 55, delete "of"
Col. 8, line 25, change "12B;" to --12B,--

Col. 8, line 65, change "differntial" to --differential--
Col. 9, line 8, change "aid" to --said--
        line 35, after "signal" insert --.--
        line 58, change "aid" to --said--
        line 59, change "aid" to --said--
Col. 10, line 23, change "differntial" to --differential--
```

Signed and Sealed this

Thirteenth Day of February, 1996

Attest:

BRUCE LEHMAN

*Attesting Officer*      Commissioner of Patents and Trademarks